United States Patent
Shin et al.

(10) Patent No.: US 10,319,803 B2
(45) Date of Patent: *Jun. 11, 2019

(54) ORGANIC LIGHT-EMITTING DIODE DISPLAY

(71) Applicant: Samsung Display Co., Ltd., Yongin-si, Gyeonggi-do (KR)

(72) Inventors: Hwang Sup Shin, Seongnam-si (KR); Jin Goo Jung, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/968,236

(22) Filed: May 1, 2018

(65) Prior Publication Data
US 2018/0247995 A1  Aug. 30, 2018

Related U.S. Application Data

(63) Continuation of application No. 15/228,974, filed on Aug. 4, 2016, now Pat. No. 10,002,916.

(30) Foreign Application Priority Data

Aug. 6, 2015 (KR) .......................... 10-2015-0111262

(51) Int. Cl.
 *H01L 27/32* (2006.01)
 *G09G 3/32* (2016.01)
 *G09G 3/3233* (2016.01)
(52) U.S. Cl.
 CPC ........... *H01L 27/3276* (2013.01); *G09G 3/32* (2013.01); *H01L 27/3248* (2013.01);
 (Continued)

(58) Field of Classification Search
 CPC ............. H01L 27/3276; H01L 27/3262; H01L 27/3265; H01L 27/3258; H01L 27/3248; G09G 3/32
 See application file for complete search history.

(56) References Cited

U.S. PATENT DOCUMENTS

7,507,998 B2  3/2009  Tseng
8,883,572 B2  11/2014 Ma
(Continued)

FOREIGN PATENT DOCUMENTS

KR  10-2012-0104816 A  9/2012
KR  10-2014-0018623 A  2/2014
(Continued)

*Primary Examiner* — Alonzo Chambliss
(74) *Attorney, Agent, or Firm* — F. Chau & Associates, LLC

(57) ABSTRACT

An organic light-emitting diode display is disclosed. In one aspect, the display includes a semiconductor layer including a driving channel, a first gate insulating layer at least partially covering the semiconductor layer, and a first driving gate electrode formed over the first gate insulating layer and overlapping the driving. A second gate insulating layer at least partially covers the first driving gate electrode. The display also includes a second driving gate electrode formed over the second gate insulating layer and overlapping the first driving gate electrode, an interlayer insulating layer at least partially covering the second driving gate electrode, a driving voltage line formed over the interlayer insulating layer and overlapping the second driving gate electrode, and a connector formed over the interlayer insulating layer and connected to the first and second driving gate electrodes.

13 Claims, 6 Drawing Sheets

(52) U.S. Cl.
CPC ....... *H01L 27/3258* (2013.01); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2320/0238* (2013.01); *H01L 27/3262* (2013.01); *H01L 27/3265* (2013.01)

(56) References Cited

U.S. PATENT DOCUMENTS

| | | | |
|---|---|---|---|
| 8,975,630 | B2 | 3/2015 | Yoon et al. |
| 9,105,589 | B2 | 8/2015 | Bang |
| 9,117,783 | B2 * | 8/2015 | Jin ...................... H01L 27/3262 |
| 9,287,528 | B2 | 3/2016 | Kim |
| 9,390,655 | B2 * | 7/2016 | Jeong .................. H01L 27/3276 |
| 2014/0027728 | A1 | 1/2014 | Yoon et al. |
| 2014/0118232 | A1 | 5/2014 | Kim |
| 2014/0353629 | A1 | 12/2014 | Jin |
| 2015/0008395 | A1 | 1/2015 | Yoon et al. |
| 2015/0130691 | A1 | 5/2015 | Jeon |
| 2015/0170563 | A1 | 6/2015 | Bang |
| 2016/0012775 | A1 | 1/2016 | Jeong et al. |

FOREIGN PATENT DOCUMENTS

| | | |
|---|---|---|
| KR | 10-2014-0053602 A | 5/2014 |
| KR | 10-2014-0141333 A | 12/2014 |

\* cited by examiner

ORGANIC LIGHT-EMITTING DIODE DISPLAY

CROSS-REFERENCE TO RELATED APPLICATIONS

Any and all priority claims identified in the Application Data Sheet, or any correction thereto, are hereby incorporated by reference under 37 CFR 1.57. For example, this application is a continuation of U.S. patent application Ser. No. 15/228,974, filed Aug. 4, 2016, which claims priority to and the benefit of Korean Patent Application No. 10-2015-0111262 filed in the Korean Intellectual Property Office on Aug. 6, 2015, the entire contents of which are incorporated herein by reference.

BACKGROUND

Field

The described technology generally relates to an organic light-emitting diode (OLED) display.

Description of the Related Technology

An OLED display includes two electrodes and an interposed organic emission layer. Light is emitted by combining electrons injected from a cathode, which is one electrode, with holes injected from an anode, which is the other electrode, in the organic emission layer to generate excitons, allowing the excitons to release energy.

Such an OLED display includes a matrix of pixels including an OLED and multiple transistors and storage capacitors that are formed in a circuit to drive the OLED in each pixel (or pixel circuit). These transistors and storage capacitors include multiple wires, including a semiconductor, a gate line, a data line, and the like.

The higher the resolution is, the smaller the pixel size is, resulting in a smaller margin for error in the processing steps. Accordingly, a change in the widths of wires, the size of a contact hole, or an alignment error can cause defects. That is, as the resolution becomes higher, wires actually formed in a product can be formed thinner than pre-designed wires, a contact hole actually formed in the product can be formed larger than a pre-designed contact hole, and an interlayer alignment error can tend to more easily increase.

Accordingly, high resolution makes it difficult to secure the capacitance of the storage capacitor.

The above information disclosed in this Background section is only to enhance the understanding of the background of the described technology and therefore it may contain information that does not constitute the prior art that is already known in this country to a person of ordinary skill in the art.

SUMMARY OF CERTAIN INVENTIVE ASPECTS

One inventive aspect relates to an OLED display with a high resolution structure having the advantage of increasing capacitance of a storage capacitor.

Another aspect is an OLED display including: a substrate; a semiconductor including a driving channel on the substrate; a first gate insulating layer covering the semiconductor; a first driving gate electrode on the first gate insulating layer and overlapping the driving channel; a second gate insulating layer covering the first driving gate electrode; a second driving gate electrode on the second gate insulating layer and partially overlapping the first driving gate electrode; an interlayer insulating layer covering the second driving gate electrode; a driving voltage line on the interlayer insulating layer and overlapping the second driving gate electrode; and a connecting member on the interlayer insulating layer and electrically connected to the first and second driving gate electrodes.

The interlayer insulating layer and the second gate insulating layer can include a contact hole that electrically couples the connecting member with the first driving gate electrode and the second driving gate electrode.

The contact hole can expose one end of the second driving gate electrode and a part of a surface of the first driving gate electrode.

The OLED display can further include a storage capacitor which comprises: a first storage electrode on the second gate insulating layer and overlapping the driving channel; and a second storage electrode overlapping the first storage electrode while interposing the interlayer insulating layer therebetween.

The first storage electrode can be the second driving gate electrode, and the second storage electrode can be the driving voltage line.

The OLED display can further include: a scan line at a same layer as the first driving gate electrode and transmitting a scan signal; and a light emission control line disposed at a same layer as the first driving gate electrode, extending parallel to the scan line, and transmitting a light emission control signal.

The first driving gate electrode can be positioned between the scan line and the light emission control line.

A driving voltage ELVDD can be transmitted to the driving voltage line.

A gate voltage can be transmitted to the first driving gate electrode and the second driving gate electrode.

The second driving gate electrode can have a larger area than the first driving gate electrode.

The semiconductor can further include a switching channel, a compensation channel, an initialization channel, an operation control channel, a light emission control channel, and a bypass channel.

The OLED display can further include a passivation layer covering the interlayer insulating layer. The OLED includes a pixel electrode on the passivation layer, an organic emission layer on the pixel electrode, and a common electrode on the organic emission layer.

Another aspect is an organic light-emitting diode (OLED) display comprising: a substrate; a semiconductor layer including a driving channel formed over the substrate; a first gate insulating layer at least partially covering the semiconductor layer; a first driving gate electrode formed over the first gate insulating layer and overlapping the driving channel in the depth dimension of the OLED display; a second gate insulating layer at least partially covering the first driving gate electrode; a second driving gate electrode formed over the second gate insulating layer and overlapping the first driving gate electrode in the depth dimension of the OLED display; an interlayer insulating layer at least partially covering the second driving gate electrode; a driving voltage line formed over the interlayer insulating layer and overlapping the second driving gate electrode in the depth dimension of the OLED display; and a connector formed over the interlayer insulating layer and connected to the first and second driving gate electrodes.

In the above OLED display, the interlayer insulating layer and the second gate insulating layer include a contact hole through which the connector passes to connect the first and second driving gate electrodes.

In the above OLED display, the contact hole is connected to one lateral end of the second driving gate electrode and a portion of a surface of the first driving gate electrode.

The above OLED display further comprises a storage capacitor including: a first storage electrode formed over the second gate insulating layer and overlapping the driving channel in the depth dimension of the OLED display; and a second storage electrode overlapping the first storage electrode in the depth dimension of the OLED display, wherein the interlayer insulating layer is interposed between the first and second storage electrodes.

In the above OLED display, the first storage electrode is configured to function as the second driving gate electrode, wherein the second storage electrode is configured to function as a portion of the driving voltage line.

The above OLED display further comprising: a scan line formed on the same layer as the first driving gate electrode and configured to transfer a scan signal; and a light emission control line formed on the same layer as the first driving gate electrode and extending parallel to the scan line, wherein the light emission control line is configured to transfer a light emission control signal.

In the above OLED display, the first driving gate electrode is positioned between the scan line and the light emission control line.

In the above OLED display, the driving voltage line is configured to transfer a driving voltage.

In the above OLED display, each of the first and second driving gate electrode is configured to receive a gate voltage via the connector.

In the above OLED display, the second driving gate electrode has an area larger than that of the first driving gate electrode.

In the above OLED display, the semiconductor layer further includes a switching channel, a compensation channel, an initialization channel, an operation control channel, a light emission control channel, and a bypass channel.

The above OLED display further comprises a passivation layer covering the interlayer insulating layer, wherein the OLED includes a pixel electrode formed over the passivation layer, an organic emission layer formed over the pixel electrode, and a common electrode formed over the organic emission layer.

Another aspect is an organic light-emitting diode (OLED) display comprising: a first gate insulating layer; a first driving gate electrode formed over the first gate insulating layer; a second gate insulating layer formed over the first driving gate electrode; a second driving gate electrode formed over the second gate insulating layer; an interlayer insulating layer formed over the second driving gate electrode and having a contact hole formed therein; and a connector passing through the contact hole and connecting the first and second driving gate electrodes so as to form a conductive path between the electrodes.

In the above OLED display, the connector extends to and contacts the interlayer insulating layer.

The above OLED display further comprises a driving voltage line configured to transfer a driving voltage, wherein the second driving gate electrode and the driving voltage line form a storage capacitor.

In the above OLED display, the first driving gate electrode has a width that is larger than that of the second driving gate electrode.

In the above OLED display, a bottom surface of the contact hole is connected to a top surface of the first driving gate electrode.

In the above OLED display, the second driving gate electrode has an end that penetrates a side surface of the contact hole.

The above OLED display further comprises a storage line formed on the second gate insulating layer, wherein the second driving gate electrode is an extension of the storage line.

In the above OLED display, the interlayer insulating layer is thicker than a combined thickness of the first and second driving gate electrodes.

According to at least one of the disclosed embodiments, capacitance of the storage capacitor can be increased in a high resolution structure.

DETAILED DESCRIPTION OF CERTAIN INVENTIVE EMBODIMENTS

Figure 1:
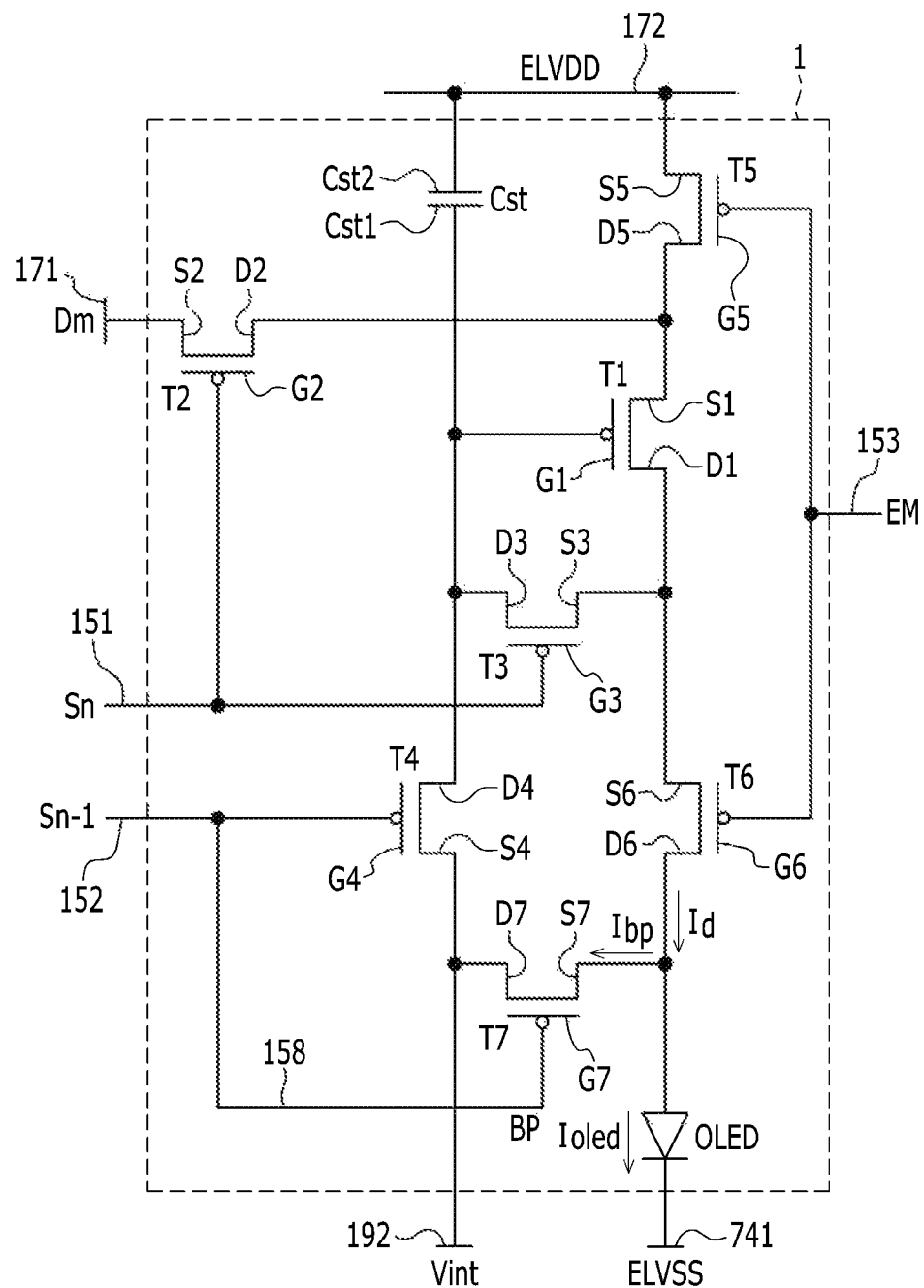
FIG. 1 is an equivalent circuit diagram of one pixel of an organic light emitting diode (OLED) display according to an exemplary embodiment.

The described technology will be described more fully hereinafter with reference to the accompanying drawings, in which exemplary embodiments are shown. As those skilled in the art would realize, the described embodiments can be modified in various different ways, all without departing from the spirit or scope of the described technology.

Parts that are irrelevant to the description will be omitted to clearly describe the described technology, and the same or similar constituent elements will be designated by the same reference numerals throughout the specification.

Further, in the drawings, the size and thickness of each element are arbitrarily illustrated for ease of description, and the described technology is not necessarily limited to those illustrated in the drawings.

In the drawings, the thickness of layers, films, panels, regions, etc., are exaggerated for clarity. In the drawings, for ease of description, the thicknesses of some layers and regions are exaggerated. It will be understood that when an element such as a layer, film, region, or substrate is referred to as being "on" another element, it can be directly on the other element or intervening elements can also be present.

In addition, unless explicitly described to the contrary, the word "comprise" and variations such as "comprises" or "comprising", will be understood to imply the inclusion of stated elements, but not the exclusion of any other elements. Further, throughout the specification, the word "on" means positioning on or below the object portion, and does not necessarily mean positioning on the upper side of the object portion based on a gravitational direction.

Further, throughout the specification, the word "on a plane" means viewing a target portion from the top, and the word "on a cross section" means viewing a cross section formed by vertically cutting a target portion from the side. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Now, an OLED display according to an exemplary embodiment will be described in detail with reference to FIGS. 1 to 5.

FIG. 1 is an equivalent circuit diagram of one pixel of an OLED display according to an exemplary embodiment.

As shown in FIG. 1, one pixel 1 of the OLED display according to the exemplary embodiment includes: a plurality of signal lines 151, 152, 153, 158, 171, 172, and 192; a plurality of transistors T1, T2, T3, T4, T5, T6, and T7 that are connected to the plurality of signal lines; a storage capacitor Cst; and an OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 for transmitting a scan signal Sn, a previous scan line 152 for transmitting a previous scan signal Sn-1 to the initialization transistor T4, a light emission control line 153 for transmitting a light emission control signal EM to the operation control transistor T5 and the light emission control transistor T6, a bypass control line 158 for transmitting a bypass signal BP to the bypass transistor T7, a data line 171 crossing the scan line 151 and transmitting a data signal Dm, a driving voltage line 172 transmitting a driving voltage ELVDD and disposed nearly parallel to the data line 171, and an initialization voltage line 192 for transmitting an initialization voltage Vint initializing the driving transistor T1.

A gate electrode G1 of the driving transistor T1 is connected to one end Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives a data signal Dm according to a switching operation of the switching transistor T2, and provides a driving current Id to the OLED.

A gate electrode G2 of the switching transistor T2 is connected to the scan line 151, a source electrode S2 of the switching transistor T2 is connected to the data line 171, and a drain electrode D2 of the switching transistor T2 is connected to the driving voltage line 172 via the operation control transistor T5 while being connected to the source electrode S1 of the driving transistor T1. The switching transistor T2 is turned on by the scan signal Sn transmitted via the scan line 151, and performs the switching operation of transmitting the data signal Dm transmitted via the data line 171 to the source electrode S1 of the driving transistor T1.

A gate electrode G3 of the compensation transistor T3 is connected to the scan line 151, a source electrode S3 of the compensation transistor T3 is connected to the anode of the OLED via the light emission control transistor T6 while being connected to the drain electrode D1 of the driving transistor T1, and a drain electrode D3 of the compensation transistor T3 is connected to a drain electrode D4 of the initialization transistor T4, one end Cst1 of the storage capacitor Cst, and the gate electrode G1 of the driving transistor T1. The compensation transistor T3 is turned on by the scan signal Sn transmitted via the scan line 151, and couples the gate electrode G1 to the drain electrode D1 of the driving transistor T1, such that the driving transistor T1 is diode-connected.

A gate electrode G4 of the initialization transistor T4 is connected to the previous scan line 152, a source electrode S4 of the initialization transistor T4 is connected to the initialization voltage line 192, and the drain electrode D4 of the initialization transistor T4 is connected to one end Cst1 of the storage capacitor Cst and the gate electrode G1 of the driving transistor T1 via the drain electrode D3 of the compensation transistor T3. The initialization transistor T4 is turned on by the previous scan signal Sn-1 transmitted via the previous scan line 152, and performs an initialization operation of transmitting the initialization voltage Vint to the gate electrode G1 of the driving transistor T1 to initialize a gate voltage of the gate electrode G1 of the driving transistor T1.

A gate electrode G5 of the operation control transistor T5 is connected to the light emission control line 153, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 153, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the OLED. The operation control transistor T5 and the light emission control transistor T6 are substantially simultaneously (or concurrently) turned on by the light emission control signal EM that is transmitted via the light emission control line 153, such that the driving voltage ELVDD is compensated by the diode-connected driving transistor T1 to be transmitted to the OLED.

A gate electrode G7 of the bypass transistor T7 is connected to the bypass control line 158, a source electrode S7 of the bypass transistor T7 is connected to both the drain electrode D6 of the light emission control transistor T6 and the anode of the OLED, and a drain electrode D7 of the bypass transistor T7 is connected to both the initialization voltage line 192 and the source electrode S4 of the initialization thin film transistor T4. In this case, since the bypass control line 158 is connected to the previous scan line 152, the bypass signal BP is the same as the previous scan signal Sn-1.

The other end Cst2 of the storage capacitor Cst is connected to the driving voltage line 172, and a cathode of the OLED is connected to a common voltage line 741 for transmitting a common voltage ELVSS.

Meanwhile, in the current exemplary embodiment, a 7 Tr-1 cap (7 Transistors and 1 capacitor) structure including the bypass transistor T7 is illustrated, but the described technology is not limited thereto, and the number of transistors and the number of capacitors can be changed in various ways.

An operation of one pixel of an OLED display according to an exemplary embodiment will now be described in detail with reference to FIG. 2.

Figure 2:
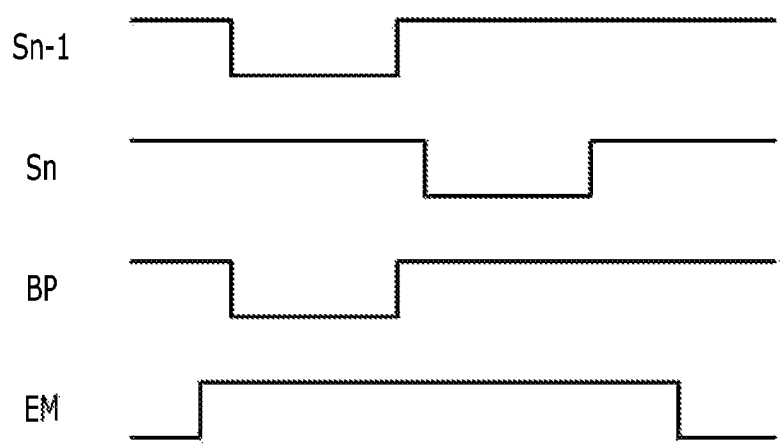
FIG. 2 is a timing diagram of a signal applied to one pixel of the OLED display according to the exemplary embodiment.

FIG. 2 is a timing diagram of a signal applied to one pixel of the OLED display according to the exemplary embodiment.

As shown in FIG. 2, first, for an initialization period, a low-level previous scan signal Sn-1 is supplied via a previous scan line 152. Then, an initialization transistor T4 is turned on in response to the low-level previous scan signal Sn-1, an initialization voltage Vint from an initialization voltage line 192 is coupled to a gate electrode G1 of a driving transistor T1 via the initialization transistor T4, and a driving transistor T1 is initialized by the initialization voltage Vint.

Subsequently, for a data programming period, a low-level scan signal Sn is supplied via a scan line 151. Then, in response to the low-level scan signal Sn, a switching transistor T2 and a compensation transistor T3 are turned on. In this case, the driving transistor T1 is diode-connected by the turned on compensation transistor T3, and is forward biased.

Then, a compensation voltage Dm+Vth (Vth is a negative value), i.e., a data signal Dm supplied from a data line 171 that is reduced by a threshold voltage Vth of the driving transistor T1, is applied to a gate electrode G1 of the driving transistor T1. A driving voltage ELVDD and the compensation voltage Dm+Vth are applied to opposite ends of a storage capacitor Cst, and an amount of charge corresponding to a voltage difference between the opposite ends is stored in the storage capacitor Cst.

Subsequently, for an emission period, a light emission control signal EM supplied from a light emission control line 153 is changed from a high level to a low level. Then, for the emission period, an operation control transistor T5 and a light emission control transistor T6 are turned on by the low-level light emission control signal EM.

Then, a driving current Id associated with a voltage difference between the gate voltage of the gate electrode G1 of the driving transistor T1 and the driving voltage ELVDD is generated, and the driving current Id is supplied to the OLED via the light emission control transistor T6. For the emission period, a gate-source voltage Vgs of the driving transistor T1 is maintained at '(Dm+Vth)-ELVDD' by the storage capacitor Cst, and according to a current-voltage relationship of the driving transistor T1, the driving current Id is proportional to the square of a value calculated by subtracting the threshold voltage of the driving transistor T1 from the source-gate voltage, i.e., '(Dm−ELVDD)$^2$'. Accordingly, the driving current Id is determined regardless of the threshold voltage Vth of the driving transistor T1.

In this case, a bypass transistor T7 receives a bypass signal BP from a bypass control line 158. Since the bypass signal BP is a predetermined level of voltage which can always turn the bypass transistor T7 off, the bypass transistor T7 is always turned off by receiving the level of voltage for turning the transistor off via the gate electrode G7, and the bypass transistor T7 is always turned off and allows the driving current Id to partially flow out as a bypass current Ibp via the bypass transistor T7 when in a turned-off state.

Even when a minimum amount of current of the driving transistor T1 representing a black image flows as a driving current, the black image is not properly displayed if the OLED emits light. Accordingly, the bypass transistor T7 of the OLED display according to the current exemplary embodiment can distributes a part of the minimum amount of current of the driving transistor T1 to current paths other than the current path toward the OLED as the bypass current Ibp. Here, the minimum amount of current of the driving transistor T1 means a current with the driving transistor T1 turned off since the gate-source voltage Vgs of the driving transistor T1 is smaller than the threshold voltage Vth. The minimum amount of driving current (e.g., current of less than about 10 pA) with the driving transistor T1 turned off is supplied to the OLED such that it is represented as a black image. When the minimum amount of driving current representing the black image flows, bypassing the bypass current Ibp has a significant effect, whereas the bypass current Ibp has virtually no effect at all if a large amount of driving current representing an image such as an ordinary image or a white image flows. Accordingly, a light emission current Ioled of the OLED, which is reduced by an amount of the bypass current Ibp flowing out from the driving current Id via the bypass transistor T7 when the driving current representing the black image flows, has a minimum amount of current at a level in which the black image is sure to be expressed. Accordingly, an accurate black image can be realized using the bypass transistor T7 to improve a contrast ratio. In FIG. 2, the bypass signal BP is the same as the previous scan signal Sn-1, but it is not necessarily limited thereto.

An OLED display according to an exemplary embodiment to which the above-described structure is applied will now be described in detail with reference to FIGS. 3 to 6.

Figure 3:
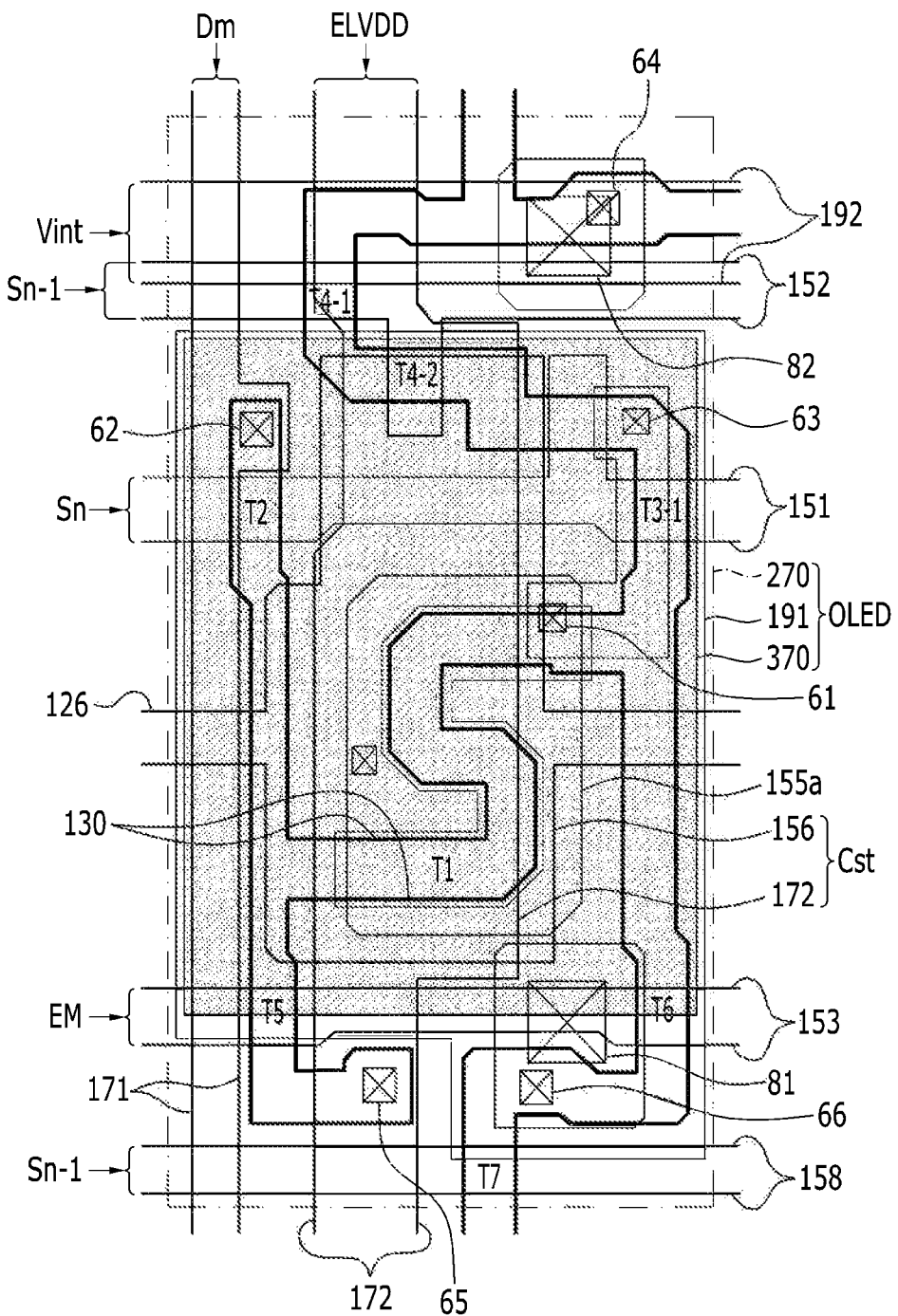
FIG. 3 schematically illustrates a plurality of transistors and capacitors of the OLED display according to the exemplary embodiment.
Figure 4:
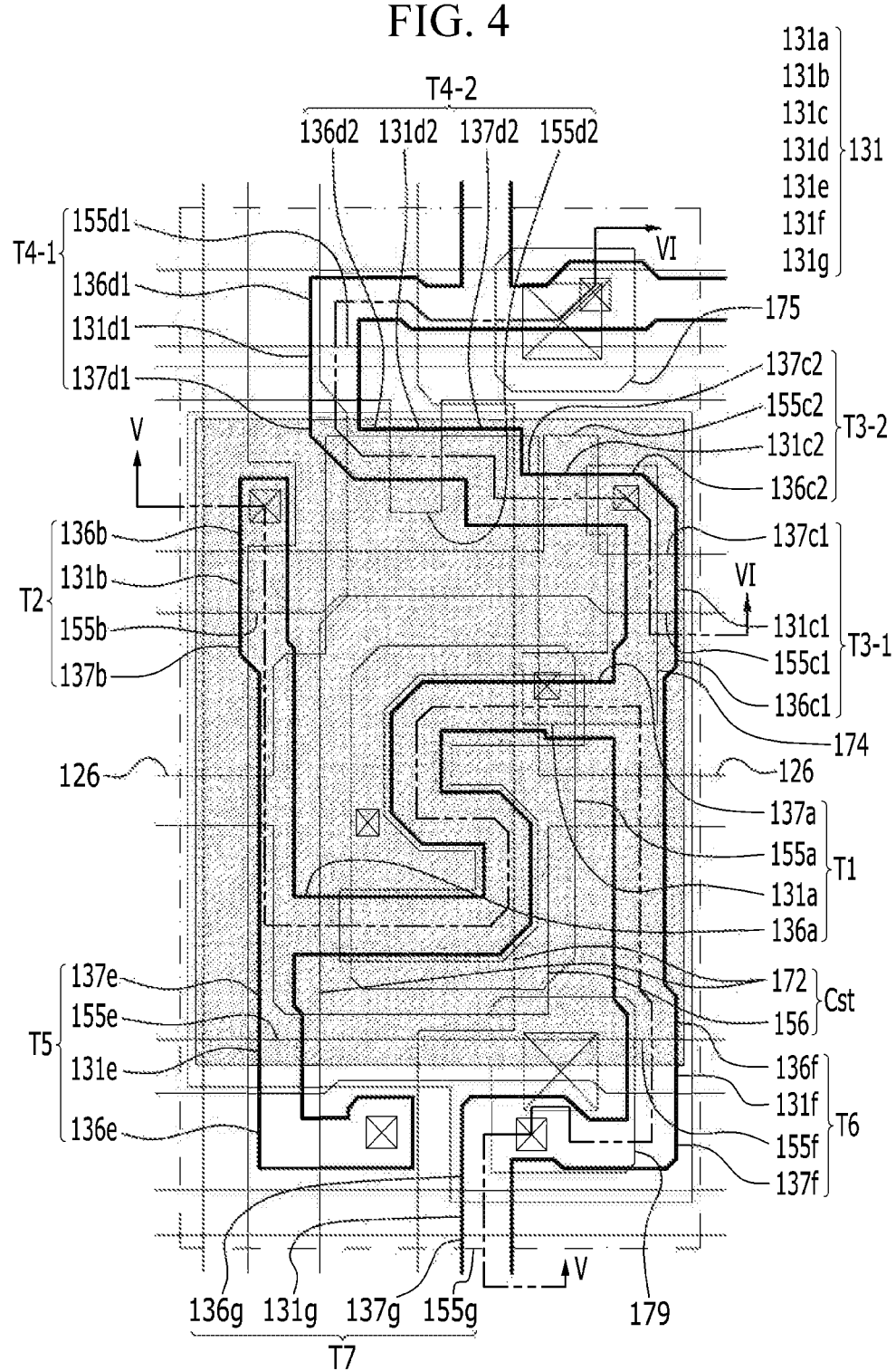
FIG. 4 is a detailed layout view of FIG. 3.
Figure 5:
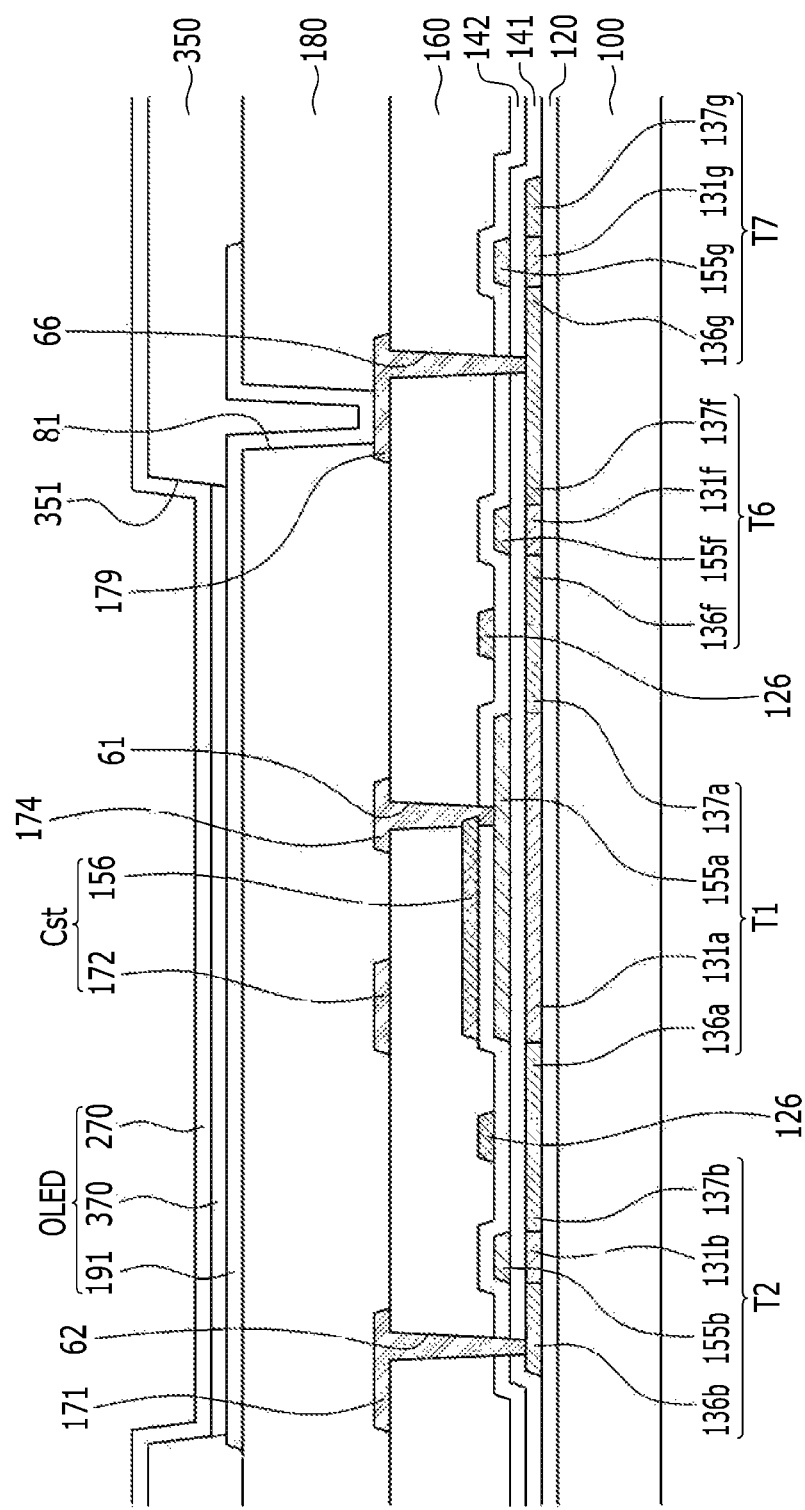
FIG. 5 is a cross-sectional view of the OLED display of FIG. 4 taken along the line V-V.
Figure 6:
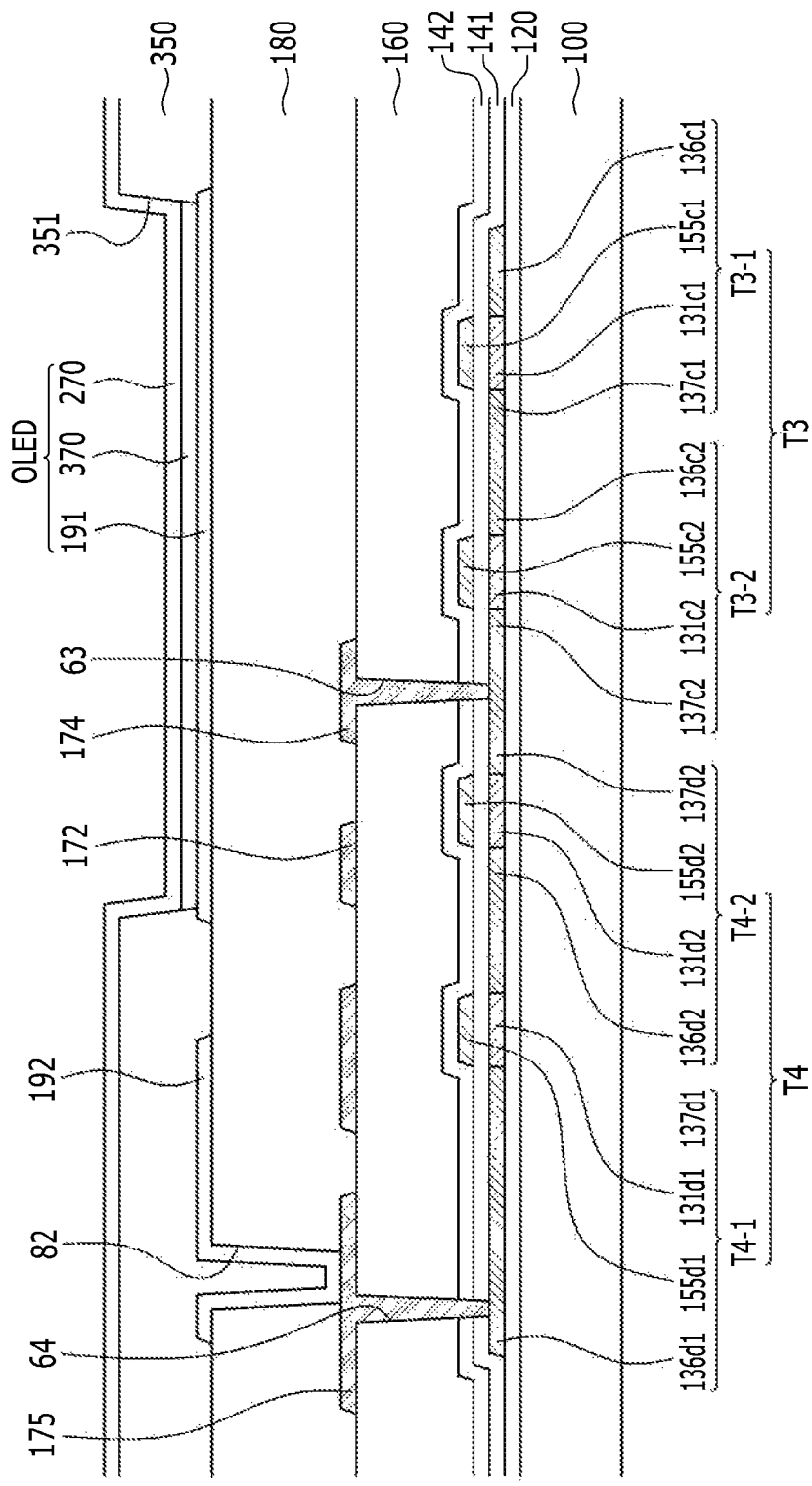
FIG. 6 is a cross-sectional view of the OLED display of FIG. 4 taken along the line VI-VI.

FIG. 3 schematically illustrates a plurality of transistors and capacitors of the OLED display according to the exemplary embodiment. FIG. 4 is a detailed layout view of FIG. 3. FIG. 5 is a cross-sectional view of the OLED display of FIG. 3 taken along the line V-V. and FIG. 6 is a cross-sectional view of the OLED display of FIG. 3 taken along the line VI-VI.

A detailed planar structure of the OLED display according to the exemplary embodiment will be described first with reference to FIGS. 3 and 4, and a detailed cross-sectional structure will be described with reference to FIGS. 5 and 6.

First, as shown in FIG. 3, the OLED display according to the current exemplary embodiment includes a scan line 151, a previous scan line 152, a light emission control line 153, and a bypass control line 158, via which a scan signal Sn, a previous scan signal Sn-1, a light emission control signal EM, and bypass signal BP are respectively applied and which are formed in a row direction. In addition, the OLED display includes a data line 171 and a driving voltage line 172 that cross the scan line 151, the previous scan line 152, the light emission control line 153, and the bypass control line 158, and that respectively apply a data signal Dm and a driving voltage ELVDD to a pixel 1. An initialization voltage Vint is transmitted from an initialization voltage line 192 to a compensation transistor T3 via an initialization transistor T4.

In addition, a driving transistor T1, a switching transistor T2, the compensation transistor T3, the initialization transistor T4, an operation control transistor T5, a light emission control transistor T6, a bypass transistor T7, a storage capacitor Cst, and an OLED are formed in pixel 1. The OLED includes a pixel electrode 191, an organic emission layer 370, and a common electrode 270. In this case, the compensation transistor T3 and the initialization transistor T4 are configured as a transistor with a dual gate structure so as to prevent current leakage.

A channel of each of the driving transistor T1, the switching transistor T2, the compensation transistor T3, the initialization transistor T4, the operation control transistor T5, the light emission control transistor T6, and the bypass transistor T7 is formed inside a semiconductor 130 that is connected, and the semiconductor 130 can be bent to be formed in various shapes. The semiconductor 130 can be formed of a polysilicon semiconductor material or an oxide semiconductor material. The oxide semiconductor material can be any one of the oxides based on titanium (Ti), hafnium (Hf), zirconium (Zr), aluminum (Al), tantalum (Ta), germanium (Ge), zinc (Zn), gallium (Ga), tin (Sn), or indium (In), and composite oxides thereof, such as an indium-gallium-zinc oxide (InGaZnO4), an indium-zinc-oxide (Zn—In—O), a zinc-tin oxide (Zn—Sn—O), an indium-gallium oxide (In—Ga—O), an indium-tin oxide (In—Sn—O), an indium-zirconium-oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), an titanium-indium-zinc oxide (Ti—In—Zn—O), and a hafnium-indium-zinc oxide (Hf—In—Zn—O). When the semiconductor 130 is formed of an oxide semiconductor material, an additional passivation layer can be added to protect the oxide semiconductor, which is vulnerable to an external environment such as high temperature and the like.

The semiconductor 130 includes a channel that is channel-doped with an N-type impurity or a P-type impurity, and source and drain doping regions that are formed at opposite sides of the channel and are doped at higher doping concentrations compared to that of the doping impurity doped in the channel. In the current exemplary embodiment, the source doping region and the drain doping region respectively correspond to a source electrode and a drain electrode. The source and drain electrodes formed in the semiconductor 130 can be formed by doping only corresponding regions. In addition, in the semiconductor 130, regions between source and drain electrodes of different transistors can also be doped, such that the source and drain electrodes are electrically coupled.

As shown in FIG. 3, a channel 131 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a first driving gate electrode 155a, a driving source electrode 136a, and a driving drain electrode 137a. The driving channel 131a is curved, and can have a meandering shape or a zigzag shape. As described above, since the driving channel 131a is curvedly formed, the driving channel 131a is formed to be long within a narrow space. Accordingly, a driving range of a gate voltage Vg applied to the first driving gate electrode 155a can be widened by the driving channel 131a that is formed to be long. Since the driving range of the gate voltage Vg is widened, a gray level of light emitted from the OLED can be more precisely controlled by changing the gate voltage Vg, thereby enhancing resolution and display quality of the OLED display. Various exemplary embodiments such as a 'reverse S', 'S', 'M', and 'W' can be implemented by modifying the shape of the driving channel 131a in different ways.

The first driving gate electrode 155a overlaps the driving channel 131a, and the driving source electrode 136a and the driving drain electrode 137a are respectively formed adjacent to opposite sides of the driving channel 131a. The first driving gate electrode 155a is connected to a first connecting member (or first connector) 174 via a contact hole 61.

The switching transistor T2 includes the switching channel 131b, a switching gate electrode 155b, a switching source electrode 136b, and a switching drain electrode 137b. The switching gate electrode 155b corresponding a downwardly extending part of the scan line 151 overlaps the switching channel 131b, and the switching source electrode 136b and the switching drain electrode 137b are respectively formed adjacent to opposite sides of the switching channel 131b. The switching source electrode 136b is connected to the data line 171 via a contact hole 62.

The compensation transistor T3 is formed as a pair to prevent current leakage, and includes a first compensation transistor T3-1 and a second compensation transistor T3-2 that are adjacent to each other. The first compensation transistor T3-1 is positioned around the scan line 151, and the second compensation transistor T3-2 is positioned around a protruding portion of the scan line 151. The first compensation transistor T3-1 includes a first compensation channel 131c1, a first compensation gate electrode 155c1, a first compensation source electrode 136c1, and a first compensation drain electrode 137c1, and the second compensation transistor T3-2 includes a second compensation channel 131c2, a second compensation gate electrode 155c2, a second compensation source electrode 136c2, and a second compensation drain electrode 137c2.

The first compensation gate electrode 155c1, which is a part of the scan line 151, overlaps the first compensation channel 131c1, and the first compensation source electrode 136c1 and the first compensation drain electrode 137c1 are respectively formed adjacent to opposite sides of the first compensation channel 131c1. The first compensation source electrode 136c1 is connected to a light emission control source electrode 136f and the driving drain electrode 137a, and the first compensation drain electrode 137c1 is connected to the second compensation source electrode 136c2.

The second compensation gate electrode 155c2, which is an upwardly protruding part of the scan line 151, overlaps the second compensation channel 131c2, and the second compensation source electrode 136c2 and the second compensation drain electrode 137c2 are respectively formed adjacent to opposite sides of the second compensation channel 131c2. The second compensation drain electrode 137c2 is connected to the first connecting member 174 via a contact hole 63.

The initialization transistor T4 is formed as a pair to prevent current leakage, and includes a first initialization transistor T4-1 and a second initialization transistor T4-2 that are adjacent to each other. The first initialization transistor T4-1 is positioned around the previous scan line 152, and the second initialization transistor T4-2 is positioned around a protruding portion of the previous scan line 152. The first initialization transistor T4-1 includes a first initialization channel 131d1, a first initialization gate electrode 155d1, a first initialization source electrode 136d1, and a first initialization drain electrode 137d1, and the second initialization transistor T4-2 includes a second initialization channel 131d2, a second initialization gate electrode 155d2, a second initialization source electrode 136d2, and a second initialization drain electrode 137d2.

The first initialization gate electrode 155d1, which is a part of the previous scan line 152, overlaps the first initialization channel 131d1, and is respectively formed adjacent to opposite sides of the first initialization channel 131d1. The first initialization source electrode 136d1 is connected to a second connecting member (or second connector) 175 via a contact hole 64, and the first initialization drain electrode 137d1 is connected to the second initialization source electrode 136d2.

The second initialization gate electrode 155d2, which is a downwardly protruding part of the previous scan line 152, overlaps the second initialization channel 131d2, and the second initialization source electrode 136d2 and the second initialization drain electrode 137d2 are respectively formed adjacent to opposite sides of the second initialization channel 131c2. The second initialization drain electrode 137d2 is connected to the first connecting member 174 via the contact hole 63.

As such, by forming the compensation transistor T3 as the pair of first and second compensation transistors T3-1 and T3-2 and the initialization transistor T4 as the pair of first and second initialization transistors T4-1 and T4-2, moving paths of electrons via the channels 131c1, 131c2, 131d1, and 131d2 can be blocked when turned off, thereby effectively preventing current leakage from being generated.

The operation control transistor T5 includes the operation control channel 131e, an operation control gate electrode 155e, an operation control source electrode 136e, and an operation control drain electrode 137e. The operation control gate electrode 155e, which is a part of the light emission control line 153, overlaps the operation control channel 131e, and the operation control source electrode 136e and the operation control drain electrode 137e are respectively formed adjacent to opposite sides of the operation control channel 131e. The operation control source electrode 136e is connected to a part of the driving voltage line 172 via a contact hole 65.

The light emission control transistor T6 includes the light emission control channel 131f, a light emission control gate electrode 155f, a light emission control source electrode 136f, and a light emission control drain electrode 137f. The light emission control gate electrode 155f, which is a part of the light emission control line 153, overlaps the light emission control channel 131f, and the light emission control source electrode 136f and the light emission control drain electrode 137f are respectively formed adjacent to opposite sides of the light emission control channel 131f. The light emission control drain electrode 137f is connected to a third connecting member (or third connector) 179 via a contact hole 66.

The bypass thin film transistor T7 includes the bypass channel 131g, a bypass gate electrode 155g, a bypass source electrode 136g, and a bypass drain electrode 137g. The bypass gate electrode 155g, which is a part of the bypass control line 158, overlaps the bypass channel 131g, and the bypass source electrode 136g and the bypass drain electrode 137g are respectively formed adjacent to opposite sides of the bypass channel 131g. The bypass source electrode 136g is connected to the third connecting member 179 via a contact hole 81, and the bypass drain electrode 137g is directly connected to the first initialization source electrode 136d1.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode, a second storage electrode and an interlayer insulating layer 160 interposed therebetween. The second driving gate electrode 156 and the driving voltage line 172 overlap each other, with the interlayer insulating layer 160 interposed therebetween, and respectively form a first storage electrode and a second storage electrode that are opposite terminals of the storage capacitor Cst.

In this case, the second driving gate electrode 156, which is an extension of a storage line 126, corresponds to the first storage electrode, and a part of the driving voltage line 172 corresponds to the second storage electrode. Here, the interlayer insulating layer 160 serves as a dielectric material, and storage capacitance is determined by an amount of charge stored in the storage capacitor Cst and a voltage between the opposite electrodes 156 and 172.

The second driving gate electrode 156 occupies a larger area than the first driving gate electrode 155a, and covers the first driving gate electrode 155a.

For example, the first driving gate electrode 155a is positioned between the scan line 151 and the light emission control line 153 that extend in a horizontal direction, and is disposed on the same layer as the scan line 151 and the light emission control line 153. In a high resolution structure, an area occupied by the first driving gate electrode 155a decreases as an interval between the scan line 151 and the light emission control line 153 decreases.

On the contrary, the second driving gate electrode 156 is positioned on the scan line 151 and the light emission control line 153, and thus in a high resolution structure, a large area can be secured even when the interval between the scan line 151 and the light emission control line 153 decreases.

In addition, the driving voltage line 172 positioned on the interlayer insulating layer 160 can secure a sufficient area even in a high resolution structure.

As described above, in the OLED display according to the current exemplary embodiment, the second driving gate electrode 156 having a larger size than the first driving gate electrode 155a is used as the first storage electrode, and the driving voltage line 172 is used as the second storage electrode, thereby increasing capacitance of the storage capacitor even in a high resolution structure.

The first driving gate electrode 155a and the second driving gate electrode 156 are electrically connected to one end of the first connecting member 174 via the contact hole 61.

The first connecting member 174 is substantially parallel to and disposed on the same layer as the data line 171, and the other end of the first connecting member 174 is connected to the second compensation drain electrode 137c2 of the second compensation transistor T3-2 and the second initialization drain electrode 137d2 of the second initialization transistor T4-2 via the contact hole 63. Accordingly, the first connecting member 174 couples the driving gate electrode 155a to both the second compensation drain electrode 137c2 of the second compensation transistor T3-2 and the second initialization drain electrode 137d2 of the second initialization transistor T4-2.

In this case, the storage capacitor Cst stores storage capacitance that corresponds to a difference between the driving voltage ELVDD transmitted to the second storage electrode via the driving voltage line 172 and the gate voltage Vg of the second driving gate electrode 156.

The third connecting member 179 is connected to the pixel electrode 191 via the contact hole 81, and the second connecting member 175 is connected to the initialization voltage line 192 via the contact hole 82.

A cross-sectional structure of an OLED display according to an exemplary embodiment will now be described in detail in accordance with a lamination order.

In this case, since an operation control transistor T5 has almost the same lamination structure as a light emission control transistor T6, a detailed description thereof will be omitted.

A buffer layer 120 is formed on a substrate 100. The substrate 100 can be formed as an insulating substrate that is formed of glass, quartz, ceramic, plastic, etc. The buffer layer 120 can serve to improve characteristics of a polysilicon semiconductor and to reduce stress applied to the substrate 100 by blocking impurities from the substrate 100 during a crystallization process for forming the polysilicon semiconductor.

A semiconductor 130 including a driving channel 131*a*, a switching channel 131*b*, a compensation channel 131*c*, an initialization channel 131*d*, an operation control channel 131*e*, a light emission control channel 131*f*, and a bypass channel 131*g* is formed on the buffer layer 120.

In the semiconductor 130, a driving source electrode 136*a* and a driving drain electrode 137*a* are formed at opposite sides of the driving channel 131*a*, and a switching source electrode 136*b* and a switching drain electrode 137*b* are formed at opposite sides of the switching channel 131*b*. In addition, a first compensation source electrode 136*c*1 and a first compensation drain electrode 137*c*1 are formed at opposite sides of the first compensation channel 131*c*1, a second compensation source electrode 136*c*2 and a second compensation drain electrode 137*c*2 are formed at opposite sides of the second compensation channel 131*c*2, a first initialization source electrode 136*d*1 and a first initialization drain electrode 137*d*1 are formed at opposite sides of the first initialization channel 131*d*1, and a second initialization source electrode 136*d*2 and a second initialization drain electrode 137*d*2 are formed at opposite sides of the second initialization channel 131*d*2. In addition, an operation control source electrode 136*e* and an operation control drain electrode 137*e* are formed at opposite sides of the operation control channel 131*e*, and a light emission control source electrode 136*f* and a light emission control drain electrode 137*f* are formed at opposite sides of the light emission control channel 131*f*. In addition, a bypass source electrode 136*g* and a bypass drain electrode 137*g* are formed at opposite sides of the bypass channel 131*g*.

A first gate insulating layer 141 is formed on the semiconductor 130 to cover it. A scan line 151 including a switching gate electrode 155*b*, a first compensation gate electrode 155*c*1, and a second compensation gate electrode 155*c*2, a previous scan line 152 including a first initialization gate electrode 155*d*1 and a second initialization gate electrode 155*d*2, a light emission control line 153 including an operation control gate electrode 155*e* and a light emission control gate electrode 155*f*, a bypass control line 158 including a bypass gate electrode 155*g*, and first gate wires 151, 152, 153, 158, 155*a*, 155*b*, 155*c*1, 155*c*2, 155*d*1, 155*d*2, 155*e*, and 155*f* including a first driving gate electrode 155*a* are formed on the first gate insulating layer 141.

A second gate insulating layer 142 is formed on the first gate wires 151, 152, 153, 158, 155*a*, 155*b*, 155*c*1, 155*c*2, 155*d*1, 155*d*2, 155*e*, and 155*f* and on the first gate insulating layer 141 to cover them. A contact hole 61 is formed in the second gate insulating layer 142. The first gate insulating layer 141 and the second gate insulating layer 142 can be formed of a silicon nitride (SiNx) or a silicon oxide (SiO2).

A storage line 126 arranged parallel to the scan line 151, and second gate wires 126 and 156, including the second driving gate electrode 156, which is an extension of the storage line 126, are formed on the second gate insulating layer 142.

An interlayer insulating layer 160 is formed on the second gate insulating layer 142 and on the second gate wires 126 and 156. The interlayer insulating layer 160 can be formed of a silicon nitride (SiNx) or a silicon oxide (SiO2).

Contact holes 61, 62, 63, 64, 65, 66, and 69 are formed in the interlayer insulating layer 160. Data wires 171, 172, 174, 175, and 179 including a data line 171, a driving voltage line 172, a first connecting member 174, a second data connecting member 175, and a third connecting member 179 are formed on the interlayer insulating layer 160.

The data line 171 is connected to the switching source electrode 136*b* via the contact hole 62 that is formed in the first gate insulating layer 141, the second gate insulating layer 142, and the interlayer insulating layer 160. One end of the first connecting member 174 is connected to the first driving gate electrode 155*a* and the second driving gate electrode 156 via the contact hole 61 that is formed in the second gate insulating layer 142 and the interlayer insulating layer 160. The other end of the first connecting member 174 is connected to the second compensation drain electrode 137*c*2 and the second initialization drain electrode 137*d*2 via the contact hole 63 formed in the first gate insulating layer 141, the second gate insulating layer 142, and the interlayer insulating layer 160.

The second gate insulating layer 142 and the interlayer insulating layer 160 commonly include the contact hole 61, and the first driving gate electrode 155*a* and the second driving gate electrode 156 are electrically connected to one end of the first connecting member 174 via the contact hole 61.

For example, the contact hole 61 partially exposes a surface of the first driving gate electrode 155*a*, and exposes one end of the second driving gate electrode 156. That is, one end of the first connecting member 174 can contact a part of a surface of the first driving gate electrode 155*a* that is exposed by the contact hole 61, and can contact one end of the second driving gate electrode 156.

The quadrangular second connecting member 175 is connected to the first initialization source electrode 136*d*1 via the contact hole 64 formed in the first gate insulating layer 141, the second gate insulating layer 142, and the interlayer insulating layer 160. In addition, the quadrangular third connecting member 179 is connected to the light emission control drain electrode 137*f* via the contact hole 66 that is formed in the first gate insulating layer 141, the second gate insulating layer 142, and the interlayer insulating layer 160.

A passivation layer 180 is formed on the data wires 171, 172, 174, 175, and 179 and on the interlayer insulating layer 160 to cover them. The passivation layer 180 can be formed as an organic layer.

A pixel electrode 191 and an initialization voltage line 192 are formed on the passivation layer 180. The third connecting member 179 is connected to the pixel electrode 191 via a contact hole 81 that is formed in the passivation layer 180, and the second connecting member 175 is connected to the initialization voltage line 192 via a contact hole 82 that is formed in the passivation layer 180.

A pixel defining layer PDL 350 is formed on edges of the passivation layer 180, the initialization voltage line 192, and the pixel electrode 191 to cover them, and the pixel defining layer 350 has a pixel opening 351 that exposes the pixel electrode 191. The pixel defining layer 350 can be formed of resins such as a polyacrylate resin and a polyimide resin or a silica-based inorganic material.

An organic emission layer 370 is formed on the exposed pixel electrode 191 by the pixel opening 351, and a common electrode 270 is formed on the organic emission layer 370. The common electrode 270 is also formed on the pixel defining layer 350, and is formed across a plurality of pixels. As described above, an OLED including the pixel electrode 191, the organic emission layer 370, and the common electrode 270 is formed.

Herein, the pixel electrode 191 is an anode which is a hole injection electrode, and the common electrode 270 is a cathode which is an electron injection electrode. However, the exemplary embodiment according to the described technology is not necessarily limited thereto, and depending on a driving method of the OLED display, the pixel electrode 191 can be a cathode while the common electrode 270 can be an anode. Holes and electrons from the pixel electrode 191 and the common electrode 270 are respectively injected into the organic emission layer 370, and light is emitted when excitons generated by combining the injected holes and electrons fall from an excited state to a ground state.

The organic emission layer 370 is formed of a low molecular organic material or a polymer organic material such as poly(3,4-ethylenedioxythiophene) (PEDOT). In addition, the organic emission layer 370 can be formed of multiple layers, including the emission layer and one or more of a hole injection layer (HIL), a hole transporting layer (HTL), an electron transporting layer (ETL), and an electron injection layer (EIL). When including all of these layers, the hole injection layer is disposed on the pixel electrode 191, which is the cathode, and the hole transporting layer, the emission layer, the electron transporting layer, and the electron injection layer are sequentially laminated thereon.

The organic emission layer 370 can include a red organic emission layer for emitting red light, a green organic emission layer for emitting green light, and a blue organic emission layer for emitting blue light, and the red organic emission layer, the green organic emission layer, and the blue organic emission layer are respectively formed on a red pixel, a green pixel, and a blue pixel, thereby realizing a color image.

Further, in the organic emission layer 370, all of the red organic emission layer, the green organic emission layer, and the blue organic emission layer are laminated together on each of the red pixel, the green pixel, and the blue pixel, such that a red color filter, a green color filter, and a blue color filter are formed for each pixel, thereby realizing a color image. Alternatively, a white organic emission layer emitting white light is formed on all of the red pixel, the green pixel, and the blue pixel, and a red color filter, a green color filter, and a blue color filter are respectively formed for every pixel to implement a color image. When the color image is implemented by using the white organic emission layer and the color filter, a deposition mask for depositing the red organic emission layer, the green organic emission layer, and the blue organic emission layer on individual pixels, that is, the red pixel, the green pixel, and the blue pixel, is not required.

The white organic emission layer described in another exemplary embodiment can be formed to have a single organic emission layer, and can further include a configuration in which a plurality of organic emission layers are laminated to emit white light. For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light can be further included.

An encapsulation member (not shown) for protecting the OLED can be formed on the common electrode 270, and the encapsulation member can be sealed inside the substrate 100 by a sealant. The encapsulation member can be formed of a variety of materials such as glass, quartz, ceramic, plastic, and a metal. Meanwhile, without using a sealant, an inorganic layer and an organic layer can be deposited on the common electrode 270 to form a thin film encapsulation layer.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display comprising:
   a substrate;
   a semiconductor layer on the substrate;
   a first insulating layer on the semiconductor layer;
   a first electrode on the first insulating layer;
   a second insulating layer on the first electrode;
   a second electrode on the second insulating layer, the second electrode overlapping the first electrode;
   a third insulating layer on the second electrode;
   a voltage line on the third insulating layer, the voltage line including a portion. overlapping the second electrode,
   wherein the portion of the voltage line and the second electrode form a capacitor.

2. The OLED display of claim 1, further comprising:
   a connector on the third insulating layer, the connector being connected to the first electrode and the second electrode to form a conductive path between the first and second electrodes.

3. The OLED display of claim 2, wherein the third insulating layer and the second insulating layer include a contact hole through which the connector passes to connect the first and second electrodes.

4. The OLED display of claim 3, wherein the contact hole is connected to one lateral end of the second electrode and a portion of a surface of the first electrode.

5. The OLED display of claim 1, wherein the semiconductor layer includes a channel overlapping the first electrode.

6. The OLED display of claim 5, further comprising:
   a scan line disposed at a same layer as the first electrode and configured to transfer a scan signal; and
   a light emission control line disposed at the same layer as the first electrode and extending parallel to the scan line, wherein the light emission control line is configured to transfer a light emission control signal.

7. The OLED display of claim 6, wherein the first electrode is between the scan line and the light emission control line in a plan view.

8. The OLED display of claim 1, wherein the voltage line is configured to transfer a driving voltage.

9. The OLED display of claim 1, wherein each of the first and second gate electrodes is configured to receive a gate voltage via the connector.

10. The OLED display of claim 1, wherein the second electrode has an area larger than an area of the first electrode.

11. The OLED display of claim 1, further comprising a passivation layer on the third insulating layer, wherein the OLED comprises a pixel electrode on the passivation layer, an organic emission layer on the pixel electrode, and a common electrode on the organic emission layer.

12. The OLED display of claim 1, further comprising a storage line on the second insulating layer, wherein the second electrode is an extension of the storage line.

13. The OLED display of claim 12, wherein the third insulating layer is thicker than a total thickness of the first and second electrodes.

* * * * *